(12) United States Patent
Soetemans et al.

(10) Patent No.: US 7,619,886 B2
(45) Date of Patent: Nov. 17, 2009

(54) METHOD AND APPARATUS FOR PROVIDING A COMMON SUPPORT SERVICES INFRASTRUCTURE FOR A NETWORK ELEMENT

(75) Inventors: Joseph Soetemans, Nepean (CA); Dion Pike, Dunrobin (CA); Gavin Gonsalves, Ottawa (CA); Jonathan Spratley, Ottawa (CA)

(73) Assignee: Alcatel-Lucent Canada Inc., Kanata, Ontario (CA)

( * ) Notice: Subject to any disclaimer, the term of this patent is extended or adjusted under 35 U.S.C. 154(b) by 1444 days.

(21) Appl. No.: 10/159,087

(22) Filed: May 31, 2002

(65) Prior Publication Data

US 2003/0058618 A1    Mar. 27, 2003

Related U.S. Application Data

(60) Provisional application No. 60/325,367, filed on Sep. 27, 2001.

(51) Int. Cl.
*H05K 7/20* (2006.01)
(52) U.S. Cl. .................. 361/694; 361/695; 454/184
(58) Field of Classification Search .......... 361/690, 361/694–695, 724, 796; 165/80.3; 454/154, 454/184
See application file for complete search history.

(56) References Cited

U.S. PATENT DOCUMENTS

| 5,130,974 A | | 7/1992 | Kawamura et al. |
| 5,210,680 A | * | 5/1993 | Scheibler ............ 361/695 |
| 5,229,925 A | | 7/1993 | Spencer et al. |
| 5,237,484 A | * | 8/1993 | Ferchau et al. ........ 361/689 |
| 5,276,893 A | | 1/1994 | Savaria |
| 5,410,536 A | | 4/1995 | Shah et al. |

(Continued)

FOREIGN PATENT DOCUMENTS

CA    2273525    5/2000

(Continued)

OTHER PUBLICATIONS

Srinivas Makam et al.; Framework for MPLS-based Recovery; Jul. 2000; pp. 1-34; internet draft.

*Primary Examiner*—Gregory D Thompson
(74) *Attorney, Agent, or Firm*—Ross D. Snyder & Associates, Inc.

(57) ABSTRACT

The present invention comprises a method and apparatus for providing a common support services infrastructure that allows a network element shelf to be used with circuit card configurations that provide enhanced and/or new data path functionality without requiring the expensive and time consuming redesign of the entire shelf unit. In one embodiment, the invention provides support services including common control and housekeeping services to a subshelf bay into which one or more subshelves may be installed. In one embodiment, the common support services that are provided include power supply services, environmental control services, information display services, and operational control and management services. In one embodiment, the subshelf bay is provided with standardized means used to supply the common support services to the subshelves. In one embodiment, each sub-shelf contains its own midplane and is operationally independent from other subshelves. The use of subshelves and the separation of providing support services (provided by the infrastructure) from providing data path functionality (provided by the subshelves) allows data path functionality to be enhanced by replacement of a subshelf without requiring redesign of the entire shelf unit.

47 Claims, 5 Drawing Sheets

U.S. PATENT DOCUMENTS

| | | | |
|---|---|---|---|
| 5,497,363 A | 3/1996 | Gingell | |
| 5,550,802 A | 8/1996 | Worsley et al. | |
| 5,574,718 A | 11/1996 | Eckhoff et al. | |
| 5,687,063 A * | 11/1997 | Chabert | 361/726 |
| 5,822,184 A * | 10/1998 | Rabinovitz | 361/685 |
| 6,289,043 B1 | 9/2001 | Kumata | |
| 6,501,768 B2 * | 12/2002 | Marin et al. | 370/465 |
| 6,542,934 B1 | 4/2003 | Bader et al. | |
| 6,591,374 B1 | 7/2003 | Christensen et al. | |
| 6,704,302 B2 | 3/2004 | Einbinder et al. | |
| 6,738,818 B1 | 5/2004 | Shah | |
| 6,760,339 B1 | 7/2004 | Noel et al. | |
| 6,768,745 B1 | 7/2004 | Gorshe et al. | |
| 6,816,590 B2 * | 11/2004 | Pike et al. | 379/329 |
| 6,823,470 B2 | 11/2004 | Smith et al. | |
| 6,839,361 B2 * | 1/2005 | Marin et al. | 370/535 |
| 6,850,704 B1 | 2/2005 | Dave | |
| 6,861,943 B2 * | 3/2005 | Pike et al. | 340/3.9 |
| 6,973,229 B1 * | 12/2005 | Tzathas et al. | 385/16 |
| 7,085,225 B2 | 8/2006 | Schaller et al. | |
| 7,095,735 B2 | 8/2006 | Pike et al. | |
| 7,099,271 B2 | 8/2006 | Friesen et al. | |
| 7,099,979 B2 | 8/2006 | Soetemans et al. | |
| 7,209,477 B2 * | 4/2007 | Pike | 370/360 |
| 7,233,568 B2 | 6/2007 | Goodman et al. | |
| 7,289,436 B2 | 10/2007 | Schaller et al. | |
| 2002/0044525 A1 | 4/2002 | Czerwiec et al. | |
| 2002/0059424 A1 | 5/2002 | Ferguson et al. | |
| 2002/0099972 A1 | 7/2002 | Walsh et al. | |
| 2002/0165961 A1 | 11/2002 | Everdell et al. | |
| 2003/0058618 A1 | 3/2003 | Soeteman et al. | |
| 2003/0061313 A1 | 3/2003 | Soetemans | |
| 2006/0274736 A1 | 12/2006 | Pike et al. | |

FOREIGN PATENT DOCUMENTS

| | | |
|---|---|---|
| WO | WO 01/61909 A1 | 8/2001 |

* cited by examiner

METHOD AND APPARATUS FOR PROVIDING A COMMON SUPPORT SERVICES INFRASTRUCTURE FOR A NETWORK ELEMENT

RELATED APPLICATIONS

This application claims the benefit of U.S. Provisional Application No. 60/325,367, filed Sep. 27, 2001.

FIELD OF THE INVENTION

The present invention relates to the field of network elements, and more particularly to a method and apparatus for providing a common support services infrastructure for network elements.

BACKGROUND OF THE INVENTION

Network elements are components used in communications networks. A common type of network element is a switch. A switch routes data from a plurality of data input paths to a variety of data output paths dependent on the destination of the data.

Network elements are often physically constructed in units referred to as "shelves." A shelf typically comprises a main housing provided with a power supply system, an environmental control (i.e. cooling) system, user controls, information displays, and a main circuit board, called a "backplane" or a "midplane." The backplane or midplane provides a number of slots or sockets to which circuit components or "cards" can be mounted. A "backplane" circuit board typically has card slots on only one of its surfaces. A "midplane" typically has card slots on both sides. The "backplane" or "midplane" is typically mounted in the housing so that cards can be inserted or removed from the outside. The circuit board provides one or more communications busses and other electrical connections to which each card is electrically connected when inserted in a slot or socket. A backplane can be very complex, containing a dozen or more slots on each surface and hundreds of interconnections between and among the slots.

Types of cards used in switches include line processing cards, intershelf communications cards, and control cards. The majority of cards in a network element are commonly line processing cards, which provide the data path functionality for the network element. One and often two (for redundancy) slots are sometimes populated with control cards that provide control, accounting and management functions for the line processing cards.

Although prior art shelves provide some flexibility by allowing different cards providing different kinds of data path functionality to be plugged into the backplane or midplane slots, that flexibility is limited because the circuit cards used must be compatible with the parameters of the particular slot configuration provided by the backplane/midplane. Prior art network element shelves cannot be used with cards that have new or different configurations and that provide new or improved data path functionality. To utilize new card configurations and capacities, a completely new shelf, including a new backplane or midplane, must be designed. As a result, the process of upgrading to new features and capabilities is time consuming and expensive for manufacturers and users.

SUMMARY OF THE INVENTION

The present invention comprises a method and apparatus for providing a common support services infrastructure that allows a network element shelf to be used with circuit card configurations that provide enhanced and/or new data path functionality without requiring the expensive and time consuming redesign of the entire shelf unit. In one embodiment, the invention provides support services including common control and housekeeping services to a subshelf bay into which one or more subshelves may be installed. In one embodiment, the common support services that are provided include power supply services, environmental control services, information display services, and operational control and management services. In one embodiment, the subshelf bay is provided with standardized means used to supply the common support services to the subshelves. In one embodiment, each sub-shelf contains its own midplane and is operationally independent from other subshelves. The use of subshelves and the separation of providing support services (provided by the infrastructure) from providing data path functionality (provided by the subshelves) allows data path functionality to be enhanced by replacement of a subshelf without requiring redesign of the entire shelf unit.

DESCRIPTION OF THE PREFERRED EMBODIMENT

A method and apparatus for providing a common support services infrastructure to a network element is disclosed. In the following description, numerous specific details are set forth to provide a thorough description of the invention. However, it will be apparent to one skilled in the art that the invention may be practiced without these specific details. In other instances, well-known features have not been described in detail so as not to obscure the invention.

Figure 1A:
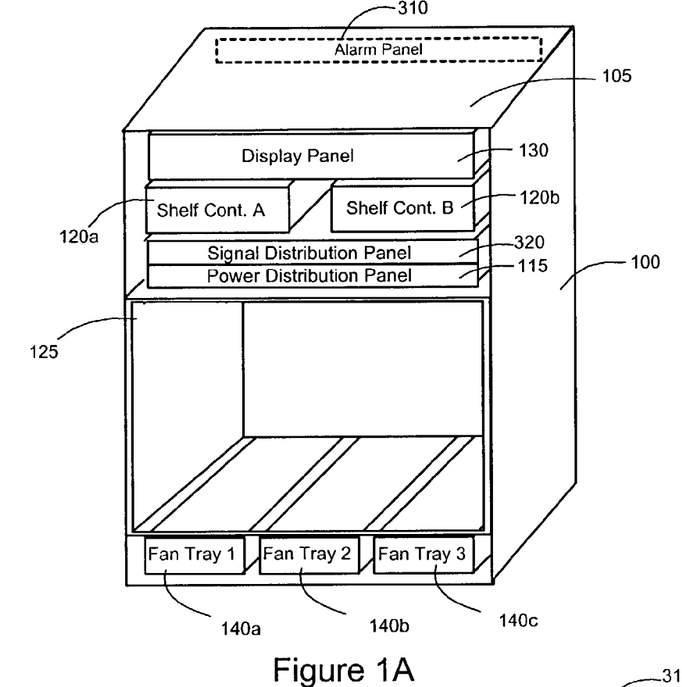
FIGS. 1A and 1B show embodiments of a network element shelf comprising the infrastructure of the invention.
Figure 1B:
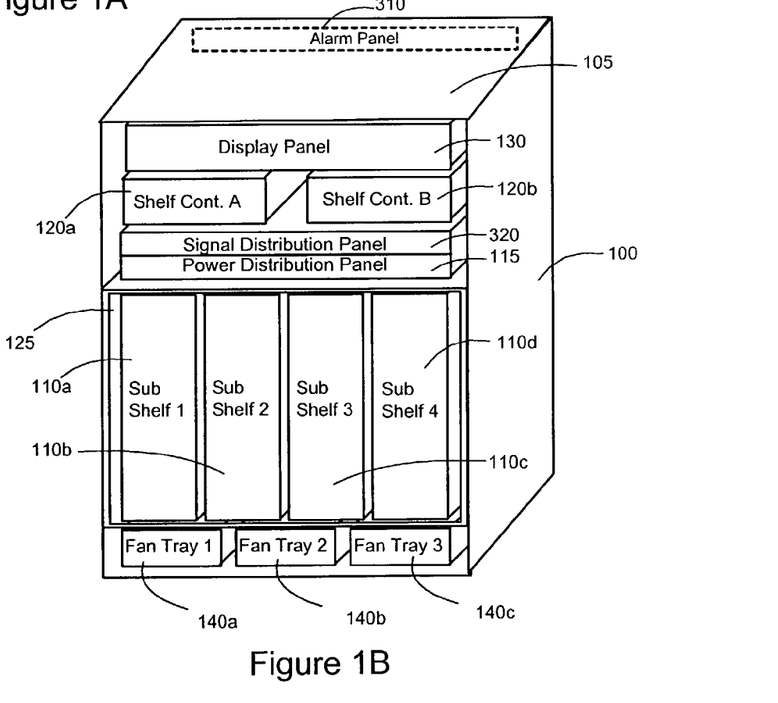

FIGS. 1A and 1B show basic components of a network element shelf 100 comprising the present invention. A shelf such as shelf 100 that embodies the present invention is also sometimes referred to herein as a "universal shelf."

As shown in FIG. 1A, universal shelf 100 includes a housing 105 together with a plurality of components that provide support services to subshelves that may be inserted into subshelf bay 125. FIG. 1B shows subshelf bay 125 occupied by four subshelves 110a-110d. Subshelves 110a-d comprise independent, removable modules (also referred to as "field replaceable units" or "FRU's"), each with its own backplane or midplane to which circuit cards can be mounted. Depending on the embodiment and the requirements of the cards mounted on subshelves 110a-d, a number of different support services may be provided, including electrical power supply services, environmental control services, control, management and accounting services, and user interface services. In the embodiment of FIGS. 1A and 1B, the components that provide support services include power distribution panel 115, signal distribution panel 320, shelf controllers 120a-b, display panel 130, alarm panel 310, and fan trays 140a-c.

Power distribution panel 115 comprises a power supply system that provides electrical power connections to each of subshelves 110a-d. As one example, power distribution panel 115 may include conductive interconnects for distributing power, such as terminal blocks. In one embodiment, power distribution panel 115 is connected to an external power source from which it receives power for distribution.

Signal distribution panel 320 comprises conductive interconnects allowing for the distribution of signals. In one embodiment, signal distribution panel 320 is coupled to shelf controllers 120a-b, display panel 130, and fan trays 140a-c.

Shelf controllers 120a-b form a redundant pair of intelligent controllers that provide control, diagnostic, accounting and management services to each of the subshelves 110a-d and to components (for example line processing cards) installed in subshelves 110a-d.

Display panel 130 provides LED indicators and/or other displays that can be utilized to display status information for subshelves 110a-d (e.g. functional status).

Alarm panel 310 provides communication of the status of the system. In one embodiment, alarm panel 310 provides indications of alarm conditions and accepts external alarm inputs. Alarm panel 310 may also provide other status indications pertaining to shelf controllers 120a-b.

Fan trays 140a-c comprise cooling fans that provide cooling air flow through subshelf bay 125 in which subshelves 110a-d are mounted.

The number of subshelves that subshelf bay 125 can accommodate is determined by the physical width of the subshelves 110a-d and the number of support services connections provided to subshelf bay 125. In the embodiment of FIGS. 1A and 1B, subshelf bay 125 is configured to accommodate up to four separate subshelves 110a-d by providing four subshelf mounting positions and four sets of support services connections. Subshelves 110a-d may occupy one or more of the four subshelf positions of subshelf bay 125. In the embodiment of FIG. 1A, subshelves 110a-110b are each single-width subshelves. Each occupies one of the four available subshelf positions in subshelf bay 125 and utilizes one of the four available sets of support services connections. However, subshelf bay 125 is not limited to single-width subshelves, but can accommodate subshelves that take up more than one or even all four positions. It is not required that all available subshelf positions be utilized. Dummy face panels may be used to seal empty subshelf positions to maintain proper cooling air flow through subshelf bay 125.

Figure 2A:
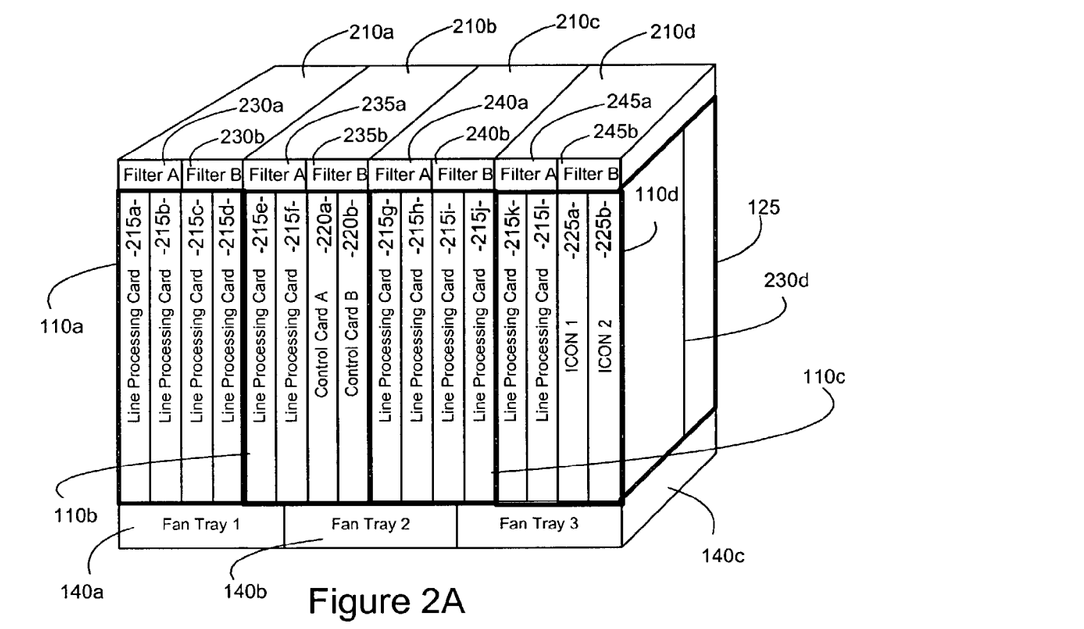
FIGS. 2A and 2B show embodiments of subshelves of the invention.
Figure 2B:
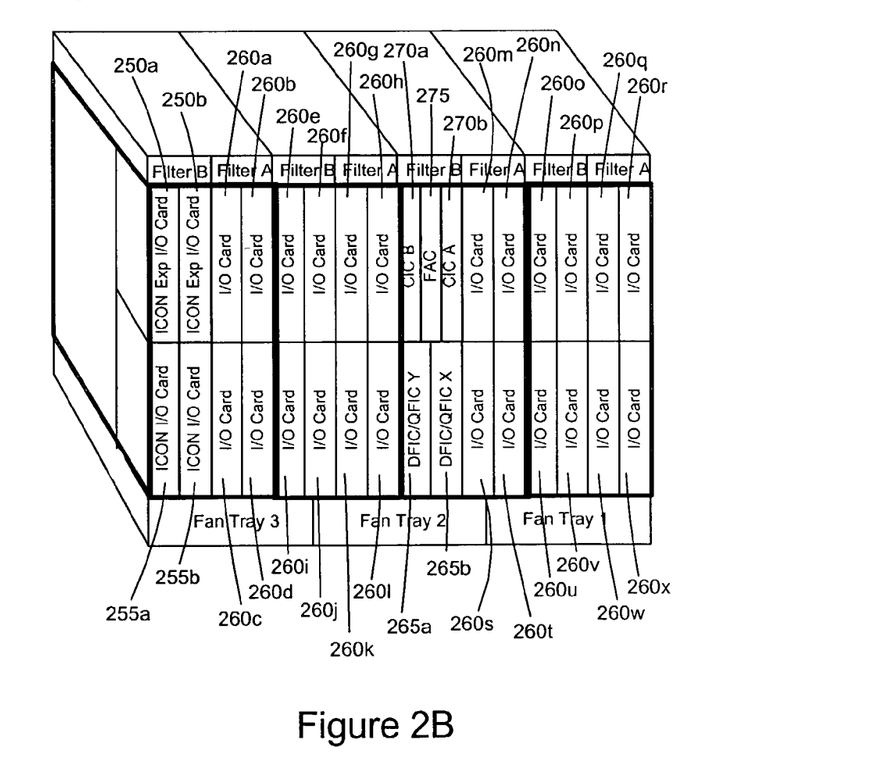

FIGS. 2A and 2B are more detailed front and rear schematic views, respectively, of example embodiments of subshelves 110a-d and subshelf bay 125. As such, these views should be understood to represent examples of how the subshelves 110a-d and subshelf bay 125 may be implemented and not to impose constraints on implementation of subshelves 110a-d and subshelf bay 125. FIGS. 2A and 2B also show fan trays 140a-c and power filter modules 210a-d. Each of power filter modules 210a-d comprises two power filters (230a-b, 235a-b, 240a-b and 245a-b) that provide redundant filtered electrical power connections to each of the four subshelf positions of subshelf 125. In one embodiment, each filtered power connection supplied by filters 230a-b, 235a-b, 240a-b and 245a-b provides a 48V, 1000 W power source. In one embodiment, filters 230a-b, 235a-b, 240a-b and 245a-b are incorporated as part of the power supply system of power distribution panel 115. In another embodiment, power distribution panel 115 provides redundant, raw, unfiltered power connections to each subshelf position, and filters 230a-b, 235a-b, 240a-b and 245a-b are included in the respective subshelves 110a-d themselves. In such an embodiment, power distribution panel 115 may be implemented using a power terminal block.

In the embodiment of FIGS. 2A and 2B, subshelves 110a-d each comprise a midplane (only midplane 230d of subshelf 110d is visible on FIGS. 2A and 2B) that provide slots to which line processing and other functionality-providing cards can be mounted. In the embodiment of FIGS. 2A and 2B, universal shelf 100 is configured as an input/output (I/O) data path shelf that is part of a multi-shelf router switch system. An example of such a multi-shelf router switch system is the Alcatel 7670 multi-shelf system, described in copending patent application Ser. No. 10/152,857 for "Method and Apparatus for Optimization of Redundant Link Usage in a Multi-Shelf Network Element" assigned to the assignee of the present invention and incorporated by reference herein.

In the embodiment of FIGS. 2A and 2B, subshelves 110a-d provide data path functionality, as well as participating in intershelf control and communications functions, such as those provided by shelf controllers 120a-b. Subshelves 110a-d do so by virtue of cards mounted to the front and back side slots of their respective midplanes.

In the embodiment of FIGS. 2A and 2B, each of subshelves 110a-d comprises four front-mounted slots to which cards can be mounted. The types of cards mounted to the front slots of subshelves 110a-d shown in FIG. 2A include line processing cards 215a-215l, control cards 220a and 220b, and intershelf connection (ICON) cards 225a-b. The types of cards mounted to the back of subshelves 110a-d shown in FIG. 2B include ICON expansion I/O cards 250a-b, ICON I/O cards 255a-b, data path I/O cards 260a-x, fabric interface cards (FIC) 265a-b, controller interface cards (CIC) 270a-b, and facilities card (FAC) 275. These are only a few examples of types of cards that can be mounted in subshelves 110a-d. In other embodiments, other cards providing the same or different functionality may be used. For example, in a preferred embodiment, control cards 220a and 220b and intershelf connection (ICON) cards 225a-b are omitted and replaced with additional line processing cards. Likewise, ICON expansion I/O cards 250a-b, ICON I/O cards 255a-b, fabric interface cards (FIC) 265a-b, controller interface cards (CIC) 270a-b, and facilities card (FAC) 275 are omitted and replaced with additional data path I/O cards. The functionality of universal shelf 100 can be changed to a lesser extent by changing the cards in the subshelves and to a greater extent by changing the subshelves themselves.

In the embodiment of FIGS. 2A and 2B, line processing cards 215a-215l provide data path functionality for the multi-shelf system of which universal shelf 100 is a part. Control cards 220a-b provide intershelf control and management functions. Intershelf connection cards 225a-b provide intershelf communications functions. ICON expansion I/O cards 250a-b and ICON I/O cards 255a-b provide control path connections between universal shelf 100 and other shelves of the multi-shelf. I/O cards 260a-x provide connections to the data communications media for which switching services are being provided. Fabric interface cards 265a-b provide high capacity connections to the switching fabric (e.g. to dedicated switching shelves in one embodiment of the invention). Controller interface cards provide an interface between control cards 220a-b and line processing cards 215e-f in subshelf 110b, and facilities card 275 provides an RS232 management port and two timing ports that can be attached to a timing source for system synchronization.

In the embodiment of FIGS. 2A and 2B, the appearance of a fully populated subshelf bay 125 is not immediately distinguishable from a prior art shelf having a single midplane to which all cards are mounted. The separateness of the individual subshelves is not immediately visually apparent.

Figure 3:
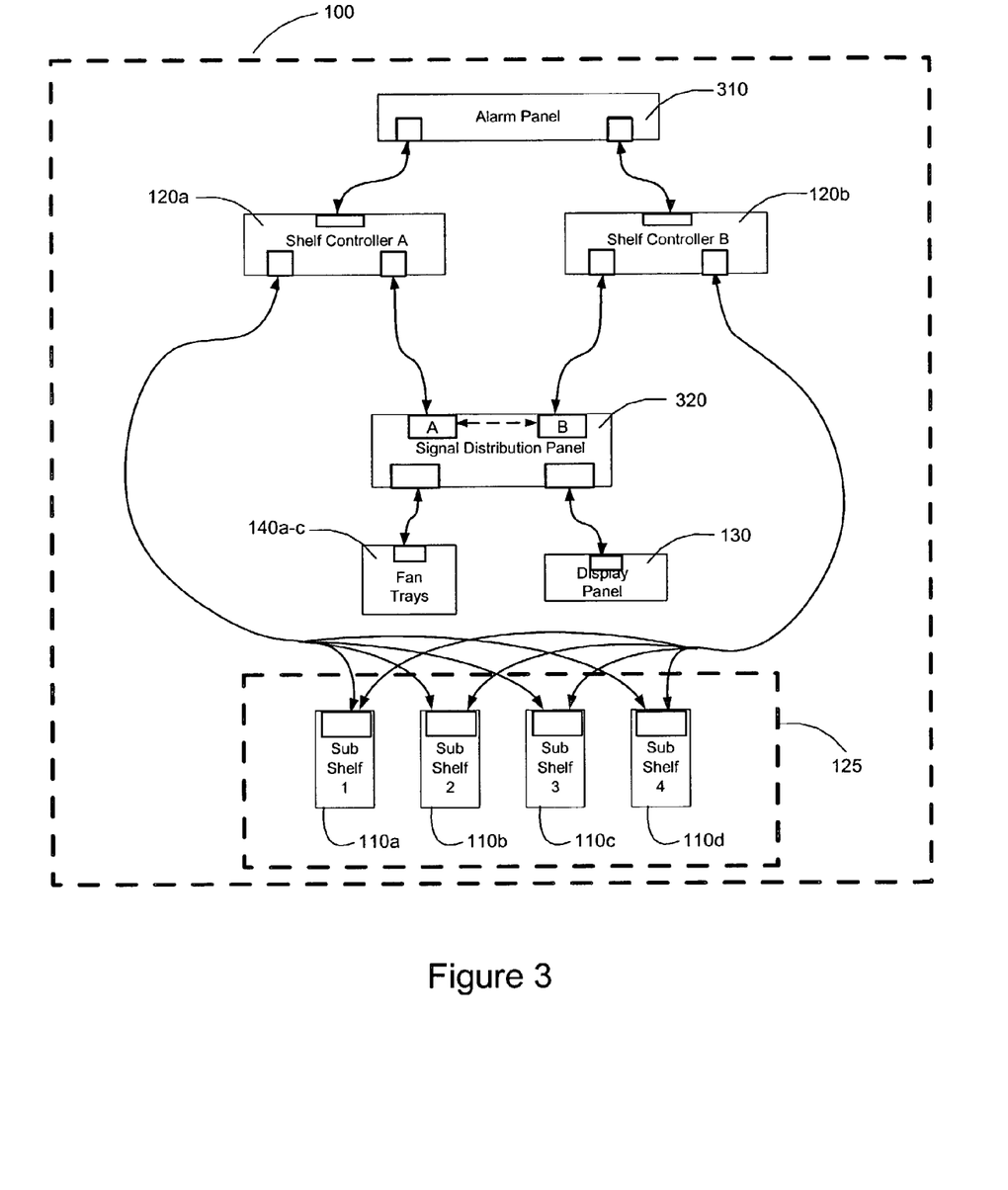
FIG. 3 shows the distribution of services in an embodiment of the invention.

FIG. 3 shows how control services provided by universal shelf 100 are distributed to subshelves 110a-d in an embodiment of the invention. The control services provided by universal shelf 100 in the embodiment of FIG. 3 are managed by a redundant pair of shelf controllers 120a-b. In one embodiment, shelf controllers 120a-b negotiate amongst themselves according to predetermined and/or adaptive criteria to determine which of the two is at any point in time the active controller.

Each shelf controller 120a-b is provided with a separate control services connection to each subshelf position of subshelf bay 125. These connections are separate from the power supply connections provided by the power supply system of power distribution panel 115 (which, in one embodiment, comprise separate three-wire connections). In the embodiment of FIG. 3, subshelf bay 125 provides four shelf positions. Hence four separate control services connections are provided from each shelf controller 120a-b to subshelf bay 125. In one embodiment, the connections from both shelf controllers to a subshelf position comprise a standard 50-pin connector. In another embodiment, separate connections are provided from each of shelf controllers 120a-b to each subshelf position. The particular connector or connector provided to a subshelf position is intended to mate with a counterpart connector of a subshelf that is inserted in that position. In embodiments in which a subshelf spans more than one subshelf position of subshelf bay 125, more than one of the control services connectors may connect to a single subshelf, increasing the card-carrying capacity of the subshelf.

In the embodiment of FIG. 3, connections are also provided between each of shelf controllers 120a-b and alarm panel 310 and signal distribution panel 320. Signal distribution panel 320 in turn is connected to fan trays 140a-c and display panel 130. These connections allow shelf controllers 120a-b to control the operation of alarm panel 310, display panel 130, and fan trays 140a-c.

Control services provided by shelf controllers 120a-b to each of subshelves 110a-d include control, diagnostic, accounting and management services. These services are provided using a standard set of communications protocols that are used by shelf controllers 120a-b to communicate with subshelves 110a-d and with individual circuit cards inserted in subshelves 110a-d. In one embodiment, the diagnostic services provided by shelf controllers 120a-b include monitoring the operational status of each subshelf and each circuit card of each subshelf and indicating the status (for example normal, alarm, major alarm) on display panel 130 and alarm panel 310. In one embodiment, the diagnostic services include determining whether a subshelf inserted in subshelf bay 125 constitutes a known type of subshelf or an unknown type of subshelf. In one embodiment, shelf controllers 120a-b maintain a database of known shelf "profiles" that are used by shelf controllers 120a-b in determining the status of each respective subshelf 110a-d and that define services that are provided to each subshelf. Examples of types of subshelves include high speed subshelves that utilize high speed line cards, normal speed subshelves that utilize normal speed line cards, and hybrid subshelves that utilize a mixed set of cards.

Each control services connection provided from a shelf controller 120a-b to a subshelf position in subshelf bay 125 includes a plurality of separate communications channels that provide different communications capacities and protocols.

In one embodiment, the control services connection to each subshelf position in subshelf bay 125 includes four Ethernet connections and four high level data link control (HDLC) connections (a family of bit-oriented protocols providing frames of information with address, control and frame check sequence fields). The four Ethernet connections and four HDLC connections provided to each subshelf position provide the capacity for each subshelf 110 to accommodate up to eight card slots per each subshelf position utilized by the subshelf. In this example, four cards use Ethernet, while four other cards use HDLC.

Figure 5:
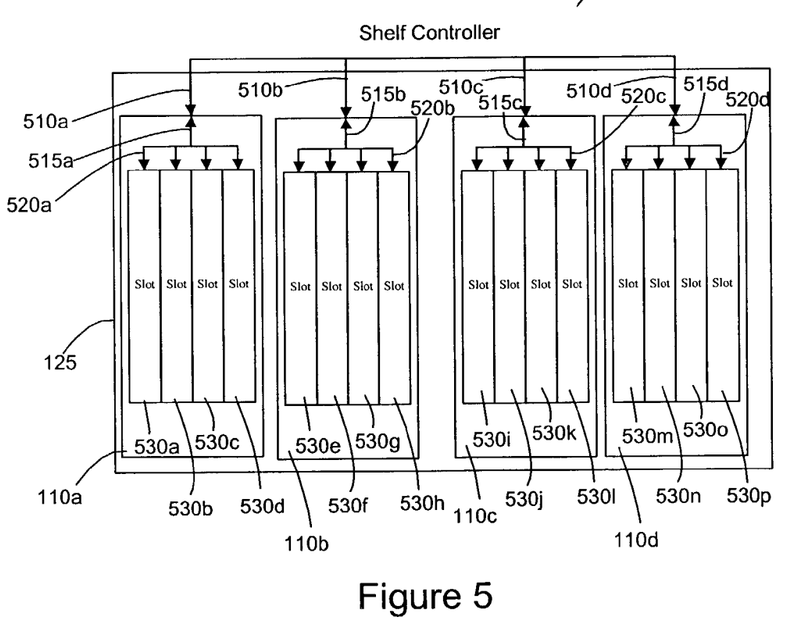
FIG. 5 shows the distribution of services in an embodiment of the invention.

FIG. 5 illustrates schematically how the connections provided by a shelf controller 120a or 120b to shelf bay 125 are distributed to and within subshelves 110a-d in an embodiment of the invention. In the embodiment of FIG. 5, each shelf controller 120 provides four control services connectors 510a-d to subshelf 125, one for each of four subshelf positions. In FIG. 5, each subshelf position of subshelf 125 is occupied by one of subshelves 110a-d, each of which features four card slots 530a-p. Each of subshelves 110a-d comprises a mating subshelf connector 515a-d that mates with the respective control services connector 510a-d. Each subshelf 110a-d in turn distributes the control services connection provided by shelf controller 120 to its subshelf connector 515a-d respective card slots 530a-p via its respective midplane 520a-d.

Power supply connections may be distributed in a similar manner, with the power supply connections provided by power distribution panel 115 to a subshelf 110a-d (via power filter modules 230a-b, 235a-b, 240a-b, and 245a-b connected within subshelves 110a-d, respectively) being distributed to its respective card slots 530a-p via its respective midplane 520a-d.

Figure 4:
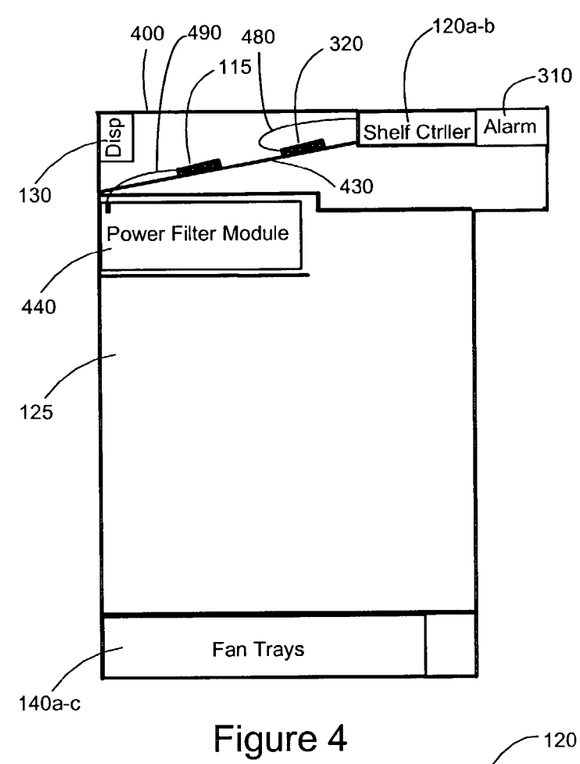
FIG. 4 shows arrangements of components in an embodiment of the invention.

FIG. 4 is a side schematic view showing the layout of components that provide support services in a network element shelf 400 of one embodiment of the invention. In the embodiment of FIG. 4, the front of shelf 400 is on the left and the back is on the right. Fan trays 140a-c are arranged below subshelf bay 125 and are removable from the front of unit 400. Subshelf bay 125 is configured to allow line processing cards to be inserted in subshelves mounted in subshelf bay 125 from the front, with data path I/O cards being inserted from the back. Display panel 130 is mounted to the top front of shelf unit 400, with alarm panel 310 mounted to the top back. Shelf controllers 120a-b are mounted at the top rear of shelf unit 400, and are accessible and removable from the back. Shelf controllers are coupled to signal distribution panel 320 via signal cables 480. Signal distribution panel 320 and power distribution panel 115 are mounted on an internal shelf 430 at the top of shelf unit 400. Power distribution panel 115 provides raw, unfiltered power to power filter module 440 via power cables 490. Power filter module 440, which provides "A" and "B" filtered power connections to each subshelf position in subshelf bay 125, is mounted at the front of shelf unit 400 below internal shelf 430 within subshelf bay 125 and may be removed and inserted as part of the subshelf.

Figure 6:
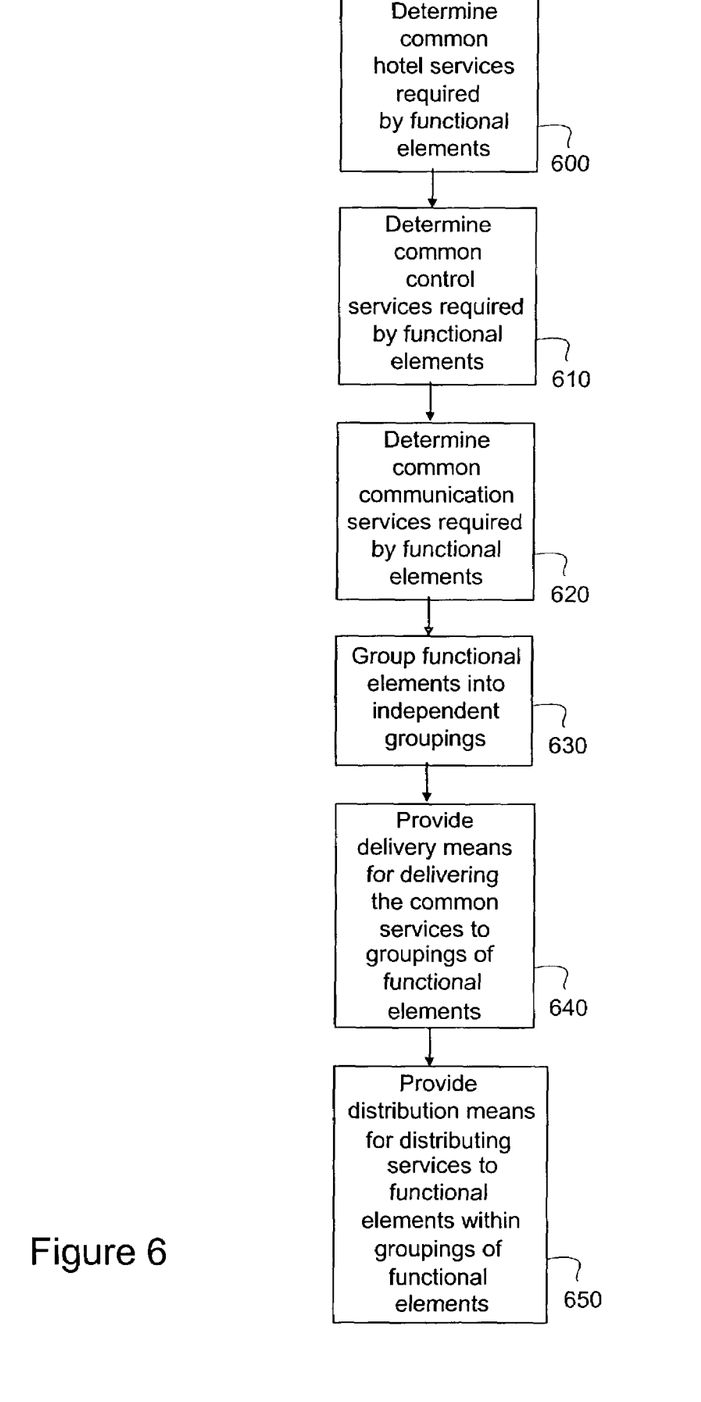
FIG. 6 is a flow chart showing a process used to provide a common support services infrastructure according to an embodiment of the invention.

FIG. 6 is a flow chart showing a process used to provide a common support services infrastructure to functional elements of a network element according to an embodiment of the invention. Here the term "functional element" refers to a functional component that provides the useful functionality for the network element utilizing the infrastructure of the invention. For example, in the embodiment of FIGS. 1A and 1B, functional elements include the line processing cards mounted in subshelves 110a-d. The support services provided include housekeeping (or "hotel") services (which include environmental control, power supply, and other physical support services), control services, and communications services.

The first steps in the process of FIG. 6 involve identifying support services within each of the three above categories of services that are commonly required by functional elements in general. Thus common hotel services, are identified at step 600, common control services at step 610, and common communications services at step 620. Examples of common hotel services include the power supply services provided by power distribution panel 115 and the environmental control services provided by fan trays 140a-c of FIGS. 1A and 1B, common control services include the control, diagnostic, accounting and management services provided by shelf controllers 120a-b, and common communication services include the intrashelf communications channels provided between shelf controllers 120a-b and subshelves 110a-d as well as user interfacing communications provided by alarm panel 310 and display panel 130.

At step 630, functional elements are grouped into independent groupings. Subshelves 110a-d of FIGS. 1A and 1B are each examples of such groupings. At step 640, means are provided for delivering the common support services identified in steps 600, 610 and 620 to the groupings created at step 630. Examples of such delivery means include the air channel formed by subshelf bay 125 (with respect to the temperature control services provided by fan trays 140a-c), the power supply connections provided by power distribution panel 115, and the control communications connections provided by control communications connectors 510a-d. Finally, at step 650, means are provided to distribute the supplied support services to the individual functional elements (such as, for example, line processing cards 215a-l and control cards 220a-b of FIG. 2) within the groupings of functional elements (e.g. subshelves 110a-d). Examples of providing such distribution means include providing midplane connections from the power and control communications input terminals of a subshelf 110a-d to each of the slots of the subshelf, and positioning midplane circuit card slots of subshelves 110a-d so as to maintain circuit cards inserted in those slots within the cooling air flow provided by fan trays 140.

The process of FIG. 6 in essence separates the housekeeping and management (control and communications) requirements of the functional cards mounted in a subshelf from the specific data path functions performed by the cards. Because basic housekeeping and management requirements can be identified that are common to cards providing many different kinds of data path functionality, the invention allows modifications to be made to the data path functionality provided by a shelf unit without requiring redesign of the entire shelf. Instead, functionality can be changed by redesigning only the cards and the subshelves.

Thus, a method and apparatus of providing a common support services infrastructure for a network element has been presented. Although the invention has been described using certain specific examples, it will be apparent to those skilled in the art that the invention is not limited to these few examples. Other embodiments utilizing the inventive features of the invention will be apparent to those skilled in the art, and are encompassed herein.

The invention claimed is:

1. A method for providing a common support services infrastructure to a network element comprising the steps of:
identifying a plurality of common support services usable by a plurality of functional elements;
establishing a plurality of groupings of functional elements;
providing said plurality of said common support services to said plurality of groupings of functional elements;
distributing said plurality of common support services to said functional elements within said plurality of groupings of functional elements.

2. The method of claim 1 wherein said step of identifying said plurality of common support services comprises determining common hotel services usable by said plurality of groupings of functional elements.

3. The method of claim 1 wherein said step of identifying said plurality of common support services comprises determining common control services usable by said plurality of groupings of functional elements.

4. The method of claim 1 wherein said step of identifying said plurality of common support services comprises determining common communication services usable by said plurality of groupings of functional elements.

5. The method of claim 2 wherein said step of identifying said plurality of common support services comprises determining common control services usable by said plurality of groupings of functional elements.

6. The method of claim 5 wherein said step of identifying said plurality of common support services comprises determining common communication services usable by said plurality of groupings of functional elements.

7. The method of claim 1 wherein said step of providing said plurality of common support services to said plurality of groupings of functional elements comprises providing a plurality of delivery channels for delivering said common support services to each of said plurality of groupings of functional elements.

8. The method of claim 7 wherein said plurality of delivery channels provided to said plurality of groupings of functional elements comprises a predetermined number of delivery channels.

9. The method of claim 8 wherein a maximum number of said plurality of groupings of functional elements is dependent on said predetermined number of delivery channels.

10. The method of claim 7 wherein said step of providing said plurality of delivery channels comprises providing a first set of delivery channels for a first of said plurality of groupings of functional elements.

11. The method of claim 10 wherein said step of providing said first set of delivery channels for said first of said plurality of groupings of functional elements comprises providing a first channel for delivering an electrical power supply to said first of said plurality of groupings of functional elements.

12. The method of claim 11 wherein said step of providing said first set of delivery channels for said first of said plurality of groupings of functional elements comprises providing a second channel for delivering control services connections to said first of said plurality of groupings of functional elements.

13. The method of claim 12 wherein said step of providing said first set of deliver channels for said first of said plurality of groupings of functional elements comprises providing a third channel for delivering communications services connections to said first of said plurality of groupings of functional elements.

14. The method of claim 13 wherein said step of providing said first set of deliver channels for said first of said plurality of groupings of functional elements comprises providing a fourth channel for delivering environmental services to said first of said plurality of groupings of functional elements.

15. The method of claim 14 wherein said fourth channel comprises a cooling air stream.

16. The method of claim 1 wherein said step of distributing said plurality of common support services to said functional elements within said plurality of groupings of functional elements comprises providing a circuit board to which said functional elements are mountable.

17. The method of claim 1 wherein said step of distributing said plurality of common support services to said functional elements within said plurality of groupings of functional elements comprises providing a circuit board with a plurality of mounting fixtures to which said functional elements are mountable.

18. The method of claim 17 wherein said circuit board comprises a backplane.

19. The method of claim 17 wherein said circuit board comprises a midplane.

20. The method of claim 13 wherein said step of providing said communications services comprises providing services for communicating with a user.

21. A support services infrastructure for a network element comprising:
    a plurality of common support services providing components;
    a plurality of sets of functional elements;
    a plurality of common support services delivery channels for delivering common support services to said plurality of sets of functional elements;
    distribution means within said plurality of sets of functional elements for distributing said common support services to said functional elements of said plurality of sets of functional elements.

22. The support services infrastructure of claim 21 wherein said plurality of common support services providing components comprise hotel services providing components.

23. The support services infrastructure of claim 21 wherein said plurality of common support services providing components comprise control services providing components.

24. The support services infrastructure of claim 21 wherein said plurality of common support services providing components comprise communication services providing components.

25. The support services infrastructure of claim 22 wherein said plurality of common support services providing components comprise control services providing components.

26. The support services infrastructure of claim 25 wherein said plurality of common support services providing components comprise communication services providing components.

27. The support services infrastructure of claim 21 wherein said plurality of common support services delivery channels comprises a predetermined number of delivery channels.

28. The support services infrastructure of claim 27 wherein a maximum number of said plurality of sets of functional elements is dependent on said predetermined number of delivery channels.

29. The support services infrastructure of claim 21 wherein said plurality of common support services delivery channels comprise a plurality of sets of delivery channels.

30. The support services infrastructure of claim 29 wherein said plurality of sets of delivery channels comprise a set of delivery channels for each of said plurality of sets of functional elements.

31. The support services infrastructure of claim 29 wherein a first of said plurality of sets of delivery channels comprises a first channel for delivering an electrical power supply to a first set of functional elements.

32. The support services infrastructure of claim 31 wherein said first of said sets of delivery channels comprises a second channel for delivering control services connections to said first set of functional elements.

33. The support services infrastructure of claim 32 wherein said first of said sets of delivery channels comprises a third channel for delivering communications services connections to said first set of functional elements.

34. The support services infrastructure of claim 33 wherein said first of said sets of delivery channels comprises a fourth channel for delivering environmental services to said first set of functional elements.

35. The support services infrastructure of claim 34 wherein said fourth channel comprises a cooling air stream.

36. The support services infrastructure of claim 21 wherein said distribution means comprises a circuit board to which said functional elements are mountable.

37. The support services infrastructure of claim 36 wherein said circuit board comprises slots to which said functional elements are mountable.

38. The support services infrastructure of claim 37 wherein said functional elements comprise circuit cards mountable to said slots.

39. The support services infrastructure of claim 38 wherein said circuit board comprises a backplane.

40. The support services infrastructure of claim 38 wherein said circuit board comprises a midplane.

41. The support services infrastructure of claim 21 wherein said plurality of sets of functional elements comprise subshelves.

42. The support services infrastructure of claim 26 wherein said communications services providing components comprise user interface components.

43. The support services infrastructure of claim 42 wherein said user interface components comprise a display panel.

44. The support services infrastructure of claim 42 wherein said user interface components comprise an alarm panel.

45. The support services infrastructure of claim 21 wherein said plurality of sets of functional elements comprise first and second sets of functional elements, said first set of functional elements providing a different functionality than said second set of functional elements.

46. The support services infrastructure of claim 38 wherein said circuit cards comprise a plurality of line processing cards.

47. A support services infrastructure for a network element comprising:
    a plurality of subshelves, each of the plurality of subshelves comprising a plurality of circuit cards;
    a first shelf controller coupled to each of the plurality of subshelves;
    a second shelf controller coupled to each of the plurality of subshelves;
    a signal distribution panel coupled to the first shelf controller and to the second shelf controller, wherein a shelf controller selected from the first shelf controller and the second shelf controller determines a status of a respective one of the plurality of subshelves and defines services that are provided to the respective one of the plurality of subshelves.

* * * * *

UNITED STATES PATENT AND TRADEMARK OFFICE
CERTIFICATE OF CORRECTION

PATENT NO. : 7,619,886 B2 Page 1 of 1
APPLICATION NO. : 10/159087
DATED : November 17, 2009
INVENTOR(S) : Soetemans et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1901 days.

Signed and Sealed this

Fourteenth Day of December, 2010

David J. Kappos
*Director of the United States Patent and Trademark Office*